United States Patent [19]

Culp

[11] Patent Number: 5,087,852
[45] Date of Patent: Feb. 11, 1992

[54] DIRECT CURRENT TRAVELING WAVE MOTOR

[75] Inventor: Gordon W. Culp, Van Nuys, Calif.

[73] Assignee: Rockwell International Corporation, El Segundo, Calif.

[21] Appl. No.: 492,152

[22] Filed: Mar. 13, 1990

[51] Int. Cl.$^5$ .................................................. H01L 41/08
[52] U.S. Cl. .................................................. 310/323; 310/328
[58] Field of Search .................................. 310/323, 328

[56] References Cited

U.S. PATENT DOCUMENTS

| | | | |
|---|---|---|---|
| 4,634,916 | 1/1987 | Okada et al. | 310/328 X |
| 4,752,711 | 6/1988 | Tsukimoto et al. | 310/323 |
| 4,950,135 | 8/1990 | Tojo et al. | 310/323 X |

FOREIGN PATENT DOCUMENTS

| | | | |
|---|---|---|---|
| 0026911 | 3/1978 | Japan | 310/328 |
| 0156283 | 8/1985 | Japan | 310/323 |
| 0137377 | 6/1986 | Japan | 310/323 |
| 0142978 | 6/1986 | Japan | 310/328 |
| 0209483 | 8/1988 | Japan | 310/323 |
| 0224680 | 9/1988 | Japan | 310/323 |
| 197709 | 9/1977 | U.S.S.R. | 310/323 |
| 197710 | 10/1977 | U.S.S.R. | 310/328 |
| 0595813 | 3/1978 | U.S.S.R. | 310/323 |
| 0646395 | 2/1979 | U.S.S.R. | 310/328 |
| 0987714 | 1/1983 | U.S.S.R. | 310/323 |
| 1053190 | 11/1983 | U.S.S.R. | 310/323 |
| 0782655 | 11/1984 | U.S.S.R. | 310/323 |

Primary Examiner—Mark O. Budd
Attorney, Agent, or Firm—H. Fredrick Hamann; Harry B. Field; John McFarren

[57] ABSTRACT

A direct current traveling wave motor generates motive force by utilizing shear deformation resulting from electrical contact between a rolling element and a layer of material that experiences shear deformation in response to an applied electric field. In a rotary piezoelectric embodiment, rotation of a motor shaft results from the non-uniform electric field intensity around the contacts between rollers surrounding the shaft and an outer race of piezoelectric material that undergoes shear deformation. Rotation occurs as the rollers roll down the faces of piezoelectric shear waves that travel with the rollers. The rollers perform the function of commutators, but without sliding friction, and they eliminate the need for traditional roller bearings. Zero clearance between motor parts results in shaft stiffness that allows precise positioning and high speed operation. The piezoelectric motor has high efficiency because sliding friction is eliminated, eddy currents are not generated, and most of the internally flowing current is local and reactive. Efficiency of the motor exceeds 98%, and its silent, smooth operation is capable of very high speeds. Speed of the motor is controlled by varying the DC potential. The motor may be operated by a battery, it does not require lubrication, and it will operate while flooded with slightly conducting fluids, such as salt water. The scale of the motor can range from miniature for driving a watch to very large for driving an oceangoing ship.

18 Claims, 1 Drawing Sheet

5,087,852

DIRECT CURRENT TRAVELING WAVE MOTOR

TECHNICAL FIELD

The present invention relates to direct current motors and, in particular, to a high speed, high efficiency, direct current traveling wave motor.

BACKGROUND OF THE INVENTION

Electromagnetic motors are well known in the prior art, but most types of motors are relatively inefficient and require provisions for removal of heat. Heat is produced by electrical resistance and sliding contact of slip rings, brushes, and commutators that transmit power between fixed and rotating structures in electric motors and generators. Furthermore, sliding contact restricts the lower limit of contact resistance, and asperities of contacts cause high frequency resistance fluctuations that generate electrical noise. The conduction of even moderate currents through sliding contacts repeatedly welds and breaks the contacts, causing a continual rearrangement of conducting material. As a result, contact surfaces become rougher with continued use. Brushes, which have a relatively small contact surface area, generally wear out faster than rings. These characteristics of resistive heating, contact welding, and short lifetime of motor parts make conventional electric motors unsatisfactory in some applications and environments.

The limitations of electric motors in environments such as outer space has led to the investigation of alternative types of transducers, actuators, and motors. Piezoelectric devices, for example, have advantages of weight and efficiency that are important considerations for applications in space. However, known piezoelectric motors and actuators require high frequency AC power and are not capable of high speed operation. Thus, there is a need for a high speed, high efficiency, direct current motor for performing work in severe environments and remote locations.

SUMMARY OF THE INVENTION

The present invention comprises a direct current traveling wave motor. Prior art alternating current resonant traveling wave piezoelectric motors generally depend on elliptical motion of a resonant elastic member to impart motion to a rotor by intermittent contact that includes sliding friction. This type of contact is accompanied by noise, heating, and wear that reduce efficiency. In contrast, the present invention generates motive force by utilizing piezoelectric shear deformation resulting from electrical contact between a rolling element and a piezoelectric layer. In an embodiment for rotation of a motor shaft, rotation results from the non-uniform electric field intensity around the contact points between rollers surrounding the shaft and an outer race of piezoelectric material that undergoes shear deformation. Rotation occurs as the rollers literally roll down the faces of piezoelectric shear waves that travel with the rollers. The rollers perform the function of commutators, but without sliding friction, and they eliminate the need for traditional roller bearings. Zero clearance between motor parts results in operational stiffness that allows precise high speed shaft positioning. Efficiency of the piezoelectric motor of the present invention is greater than that of a conventional electromagnetic motor because friction is lower, eddy currents are not generated, and most of the internally flowing current is local and reactive. Neither alternating current nor variable direct current is required for operation of the motor. Speed of the motor is controlled simply by varying the DC potential.

The direct current traveling wave motor of the present invention may be operated by a battery, which is an advantage in certain military and industrial applications. Because the motor does not require lubrication, it is useful in space and extraterrestrial robotics applications. In addition, the motor will operate while flooded with slightly conducting fluids, such as salt water, because the electric fields reside mostly interior to the piezoelectric material. Efficiency of the motor exceeds 98%, and its silent and smooth operation is capable of very high speeds. Furthermore, the scale of the motor can range from miniature for driving a watch to very large for driving an oceangoing ship, for example.

BRIEF DESCRIPTION OF THE DRAWINGS

For a more complete understanding of the present invention and for further advantages thereof, the following Description of the Preferred Embodiment makes reference to the accompanying Drawings, in which.

DESCRIPTION OF THE PREFERRED EMBODIMENT

Figure 1A:
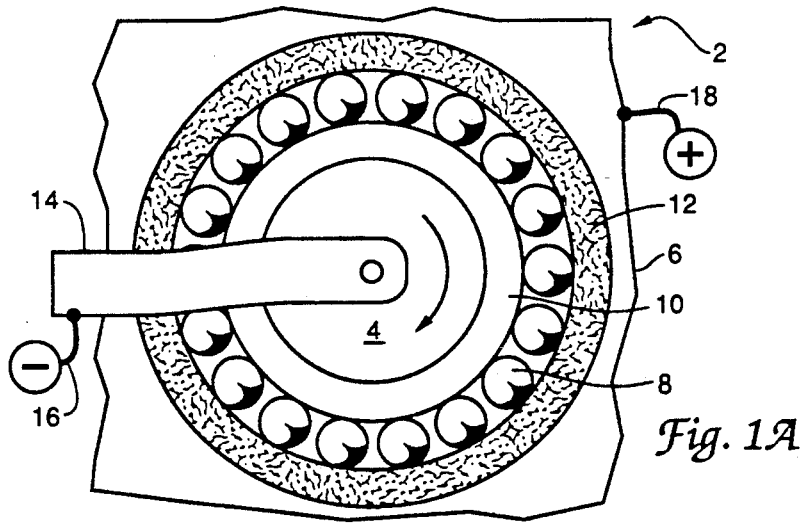
FIG. 1A is an end view taken from a point on an extension of the axis of the shaft of a direct current piezoelectric motor that embodies the present invention.
Figure 1B:
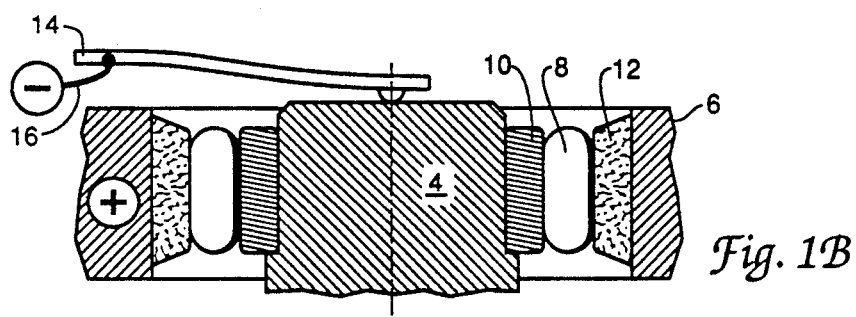
FIG. 1B is a cross sectional view of the motor of FIG. 1A.

FIGS. 1A and 1B illustrate the major components of a direct current traveling wave piezoelectric motor 2. Although the present invention is described in terms of an embodiment comprising piezoelectric material, such as polycrystalline ferroelectric ceramics and orientation-polarized polymers, the principles of the invention may be carried out with any alternative materials that exhibit useful shear deformation in response to an applied electric field. Referring to FIGS. 1A and 1B, motor 2 comprises a shaft 4 positioned for rotation within a motor housing 6. An annular inner race 10 is connected to and surrounds shaft 4. An annular outer race 12 is attached to housing 6 and positioned concentric with inner race 10. Outer race 12 comprises an annularly polarized piezoelectric material. A plurality of rollers 8 are disposed between and in electrical and frictional contact with inner race 10 and outer race 12. Rollers 8 are illustrated in the preferred embodiment as cylindrical elements, but they may be spherical in alternative embodiments of the invention. Rollers 8 are similar to conventional roller bearings, but they are loaded between inner race 10 and outer race 12 under radial compression to provide a force normal to the race surfaces at the points of contact. A lead 16 provides negative DC potential to rollers 8 through contact 14, shaft 4, and inner race 10, while lead 18 electrically grounds housing 6 or provides a positive DC potential relative to shaft 4. Except for outer race 12, all the components of motor 2 are electrical conductors. With the electrical connections as illustrated in FIGS. 1A and 1B, shaft 4 rotates in the direction indicated by the arrow on shaft 4 in FIG. 1A. Reversing the electric potential causes shaft 4 to rotate in the direction opposite the arrow. The speed of rotation corresponds to the magnitude of the applied DC potential.

Figure 2:
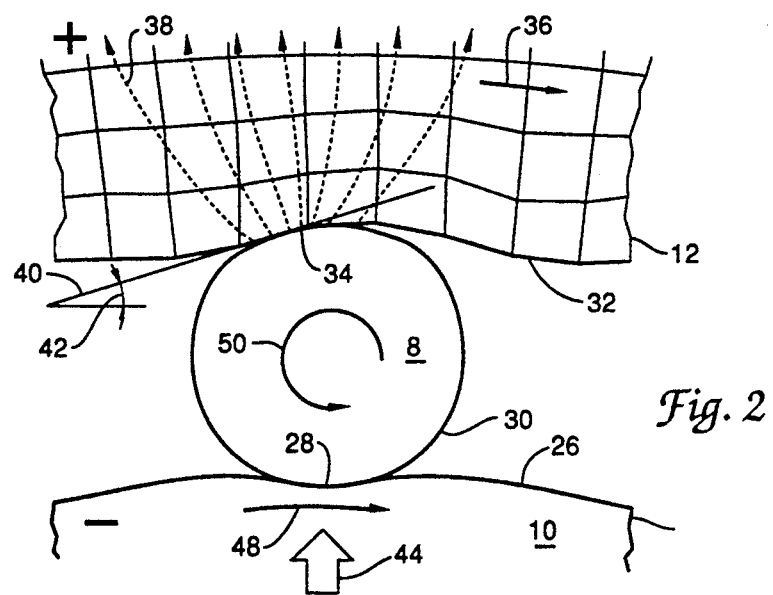
FIG. 2 is an enlarged view of a section of FIG. 1A.

FIG. 2 is an enlarged section of FIG. 1A showing one roller 8, a portion of inner race 10, and a portion of outer race 12 of motor 2. Surface 30 of roller 8 is in rolling frictional contact at point 28 with outer surface 26 of inner race 10 and at point 34 with inner surface 32 of outer race 12. The deformations of races 10 and 12 at points 28 and 34, respectively, caused by the radial compression loading described above and indicated by radial force arrow 44, are exaggerated for clarity. Outer race 12 is shown schematically as having finite block elements only for purposes of illustrating the deformation.

With no applied electric potential or shaft rotation, the deformations at points 28 and 34 caused by radial force 44 are symmetric about a radial line passing through the points of contact. However, if shaft 4 is rotated by an externally applied torque in the direction of arrow 48, roller 8 rotates hypocycloidally as indicated by arrow 50 and the deformations at the contact points 28 and 34 become asymmetric, as is well known in the art of roller bearings. This asymmetric deformation is such that it opposes shaft rotation, resulting in a portion of the resistance to rolling sometimes referred to as rolling friction.

Referring to FIG. 2, piezoelectric outer race 12 is polarized annularly in the direction indicated by arrow 36. When inner race 10 and roller 8 (both electrical conductors) are kept at a negative electrical potential relative to outer race 12, an electric field, indicated by dotted arrows 38, is created in the piezoelectric material of outer race 12. The electric field is nonuniform and is most intense near contact point 34. Electric field 38 in conjunction with piezoelectric polarization 36 causes portions of outer race 12 proximate contact point 34 to deform in shear. The amount of shear is proportional to the magnitude of the local electric field intensity. The asymmetry of the shear is indicated by tangent line 40 and angle 42 showing a mean positive slope. Angle 42 has a net positive value equal to the algebraic sum of the maximum local shear angle of the piezoelectric material adjacent contact point 34 plus the negative slope due to the rolling friction described above. The asymmetric deformation caused by piezoelectric shear is substantially greater than that caused by rolling friction. Thus, roller 8 is forced to roll in the direction of arrow 50 and, by contact friction, propel shaft 4 in the direction of arrow 48. Reversing the polarity of the applied electric potential reverses the orientation of electric field 38, thereby reversing the direction of rotation of shaft 4.

When motor 2 is idle, the static or starting torque on shaft 4 (rolling friction being absent) is approximately equal to the product of the tangent of angle 42 times the force 44 times the radius of the inner surface of outer race 12 times the number of rollers 8. Roller 8 may be thought of as rolling down the face of a traveling wave in the piezoelectric material of outer race 12. Starting torque is slightly greater than rotating torque because the rolling friction is small at low speed. When motor 2 starts, the speed of rotation of shaft 4 increases until the torque equals the counter-torque caused by factors such as rolling friction and hysteresis. The speed of motor 2 is regulated by varying the magnitude of the applied electric potential. Changing the polarity of the applied potential will slow and reverse the direction of rotation of shaft 4 without damage to motor 2. Operating motor 2 as a generator in the same direction of rotation as described above will produce direct current of opposite polarity because the contact slope, caused by rolling friction opposing the externally applied torque, is negative.

When motor 2 is operating, a piezoelectric shear wave travels with each roller 8 because each roller 8 acts as a moving electrode that forms an electric field in the piezoelectric material. Rollers 8 perform the function of commutator brushes of a conventional motor, but they operate in a smooth and continuous manner and experience rolling friction rather than sliding friction. Motor 2 operates smoothly because all rollers 8 contribute to the generation of torque, and the forces and deformations do not change intensity with time: they only change location.

Increasing the radii of rollers 8 reduces the rolling friction and contact stress, while increasing the normal forces 44 increases the friction, more so in spherical rollers than cylindrical rollers. Cylindrical rollers, which contact a plane surface along a line rather than a point, are preferred over spherical rollers because they minimize the rolling friction that opposes rotation.

Alternative embodiments of the present invention may be constructed with a piezoelectric inner race and a conductive outer race, with both races comprising piezoelectric material, or with conductive races and piezoelectric rollers. In the embodiment having both races comprising piezoelectric material, the conductive rollers assume an intermediate potential, and the piezoelectric material of the inner race is polarized in a sense opposite that of the material of the outer race so that both contacts of a roller contribute to motor torque. A linear embodiment may comprise rollers disposed between parallel planes, wherein at least one of the planes or the rollers comprise piezoelectric material. Although the invention has been described with respect to piezoelectric material, such as polycrystalline ferroelectric ceramics and orientation-polarized polymers, any material that experiences useful shear deformation in response to an applied electric field is suitable for construction of the motor.

The zero clearance between moving parts of motor 2 greatly stiffens shaft 4 in housing 6. The high resonant frequency resulting from such stiffness facilitates the use of motor 2 in applications where precise positioning is required at high speeds. In addition, motor 2 may be operated with rectified alternating current, but less smoothly than with direct current. Operation with direct current avoids the losses associated with converting to high frequency alternating current, an advantage when the power source is a battery or photovoltaic cell. Furthermore, the efficiency of motor 2 is greater than conventional electromagnetic motors because eddy currents are not generated and resistive losses are minimized. Motor 2 can also apply its starting stall torque to a torsional load without further dissipation of electrical energy, as opposed to a conventional motor that requires a constant flow of heat-generating current to maintain a torque.

Although the present invention has been described with respect to specific embodiments thereof, various changes and modifications may be suggested to one skilled in the art. Therefore, it is intended that the present invention encompass such changes and modifications as fall within the scope of the appended claims.

I claim:

1. A direct current traveling wave motor, comprising:

a first layer of material connected to a first electric potential;

a second layer of material connected to a second electric potential having a polarity opposed to that of said first electric potential;

a rolling element disposed between and in electrical and frictional contact with said first and second layers;

at least one of said first layer, said second layer, and said rolling element comprising shear-deformable material that experiences shear deformation in response to an electric field generated in said shear-deformable material as a result of said electrical contact; and a traveling wave formed by said shear deformation, said wave causing said rolling element to roll as said wave travels with the electrical contact of said rolling element, the frictional contact between said rolling element and said layers causing motion of said first layer relative to said second layer.

2. The direct current traveling wave motor of claim 1, further comprising a plurality of rolling elements disposed between and in electrical and frictional contact with said first and second layers, each of said plurality of rolling elements generating a corresponding electric field, shear deformation, and traveling wave in said shear-deformable material.

3. The direct current traveling wave motor of claim 2, wherein:

said first layer of material comprises a first cylindrical surface forming an annular outer race disposed within a motor housing;

said second layer of material comprises a second cylindrical surface forming an annular inner race joined around a motor shaft, said inner race disposed inside and concentric with said outer race; and said plurality of rolling elements comprise a plurality of cylindrical rollers loaded under radial compression between said inner race and said outer race.

4. The direct current traveling wave motor of claim 3, wherein at least one of said inner race and said outer race comprises annularly polarized, shear-deformable piezoelectric material.

5. The direct current traveling wave motor of claim 4, wherein said inner race comprises piezoelectric material annularly polarized in a first sense and said outer race comprises piezoelectric material annularly polarized in a second sense opposite said first sense.

6. The direct current traveling wave motor of claim 4, wherein the motor functions as a generator to produce said electric potentials upon rotation of said motor shaft.

7. The direct current traveling wave motor of claim 3, wherein said plurality of cylindrical rollers comprise deformable piezoelectric material.

8. A direct current traveling wave piezoelectric motor, comprising:

a first layer of material connected to a first electric potential;

a second layer of material connected to a second electric potential having a polarity opposed to that of said first electric potential;

a rolling element disposed between and in electrical and frictional contact with said first and second layers;

at least one of said first layer, said second layer, and said rolling element comprising piezoelectric material that experiences shear deformation in response to an electric field generated in said piezoelectric material as a result of said electrical contact; and a traveling wave formed by the shear deformation of said piezoelectric material, said wave causing said rolling element to roll as said wave travels with the electrical contact of said rolling element, the frictional contact between said rolling element and said layers causing motion of said first layer relative to said second layer.

9. The piezoelectric motor of claim 8, further comprising a plurality of rolling elements disposed between and in electrical and frictional contact with said first and second layers, each of said plurality of rolling elements generating a corresponding electric field, shear deformation, and traveling wave in said piezoelectric material.

10. The piezoelectric motor of claim 9, wherein:

said first layer of material comprises a first cylindrical surface forming an annular outer race disposed within a motor housing;

said second layer of material comprises a second cylindrical surface forming an annular inner race joined around a motor shaft, said inner race disposed inside and concentric with said outer race; and said plurality of rolling elements comprise a plurality of cylindrical rollers loaded under radial compression between said inner race and said outer race.

11. The piezoelectric motor of claim 10, wherein at least one of said inner race and said outer race comprises annularly polarized, shear-deformable piezoelectric material.

12. The piezoelectric motor of claim 11, wherein said inner race comprises piezoelectric material annularly polarized in a first sense and said outer race comprises piezoelectric material annularly polarized in a second sense opposite said first sense.

13. The piezoelectric motor of claim 11, wherein the motor functions as a generator to produce said electric potentials upon rotation of said motor shaft.

14. A direct current traveling wave piezoelectric motor, comprising:

a motor shaft extending within a motor housing;

a first cylindrical layer forming an annular outer race disposed within said housing and connected to a first electric potential;

a second cylindrical layer forming an annular inner race joined around said shaft and connected to a second electric potential having a polarity opposed to that of said first electric potential, said shaft positioned within said housing such that said inner race is concentric with said outer race;

a plurality of rolling elements loaded under radial compression between and in electrical and frictional contact with said inner race and said outer race;

at least one of said first cylindrical layer, said second cylindrical layer, and said plurality of rolling elements comprising piezoelectric material that experiences shear deformation in response to electric fields generated in said piezoelectric material as a result of said electrical contacts; and a plurality of traveling waves formed by the shear deformation of said piezoelectric material, said waves causing said rolling elements to roll as said waves travel with the electrical contacts of said rolling elements, the frictional contacts between said rolling elements and said races causing motion of said shaft relative to said housing.

15. The piezoelectric motor of claim 14, wherein said plurality of rolling elements comprise a plurality of cylindrical rollers.

16. The piezoelectric motor of claim 15, wherein at least one of said inner race and said outer race comprises annularly polarized, shear-deformable piezoelectric material.

17. The piezoelectric motor of claim 16, wherein said inner race comprises piezoelectric material annularly polarized in a first sense and said outer race comprises piezoelectric material annularly polarized in a second sense opposite said first sense.

18. The piezoelectric motor of claim 16, wherein the motor functions as a generator to produce said electric potentials upon rotation of said motor shaft.

* * * * *